United States Patent
Hayata

(10) Patent No.: US 6,945,446 B2
(45) Date of Patent: *Sep. 20, 2005

(54) WIRE BONDING METHOD AND APPARATUS

(75) Inventor: Shigeru Hayata, Tachikawa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 6 days.

This patent is subject to a terminal disclaimer.

(21) Appl. No.: 10/307,050

(22) Filed: Nov. 27, 2002

(65) Prior Publication Data

US 2003/0098426 A1 May 29, 2003

(30) Foreign Application Priority Data

Nov. 27, 2001 (JP) ........................................ 2001-360217

(51) Int. Cl.7 ................................................ B23K 1/06
(52) U.S. Cl. .................. 228/103; 228/180.5; 228/110.1
(58) Field of Search .................................. 228/103, 105, 228/110.1, 180.5, 9, 10, 4.1; 219/121.82, 121.83; 29/740, 748; 700/57, 58, 59, 114, 302; 382/151, 152; 156/73.2, 580.1, 580.2; 257/784, 786; 356/622

(56) References Cited

U.S. PATENT DOCUMENTS 6,449,516 B1 * 9/2002 Kyomasu et al. .............. 700/58
6,464,126 B2 * 10/2002 Hayata et al. ............... 228/105
6,467,673 B2 * 10/2002 Enokido et al. ............. 228/105

FOREIGN PATENT DOCUMENTS

| JP | 60-242627 | 12/1985 |
| JP | 7-297220 | * 11/1995 |
| JP | 8-236567 | * 9/1996 |
| JP | 10-9830 | * 1/1998 |

OTHER PUBLICATIONS

Junichi. Translation to JP 8–236567, pp. 1–9.*

* cited by examiner

Primary Examiner—Jonathan Johnson
(74) Attorney, Agent, or Firm—Koda & Androlia

(57) ABSTRACT

A bonding method and apparatus that uses a position detection camera which takes images of a workpiece and a light path conversion device which directs the image of an area near the lower end of a capillary to the position detection camera. The image acquired by the position detection camera is processed, and an execution is made so as, for instance, to measure the diameter of a ball formed on a wire extending from the lower end of the capillary, to measure the tail length extending from the lower end of the capillary, to measure the ball position from the undersurface of the capillary, to observe the bending of the tail of the wire, to inspect the external appearance of the capillary, and to measure the amplitude of vibration of the capillary when an ultrasonic vibration is applied to the capillary.

7 Claims, 12 Drawing Sheets

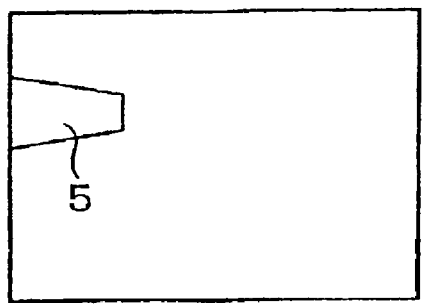
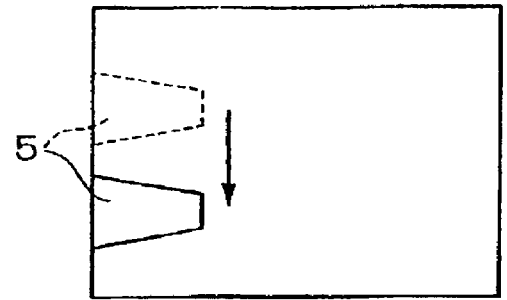
FIG. 2A　　　　　　FIG. 2B
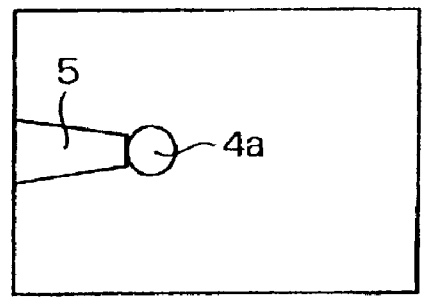
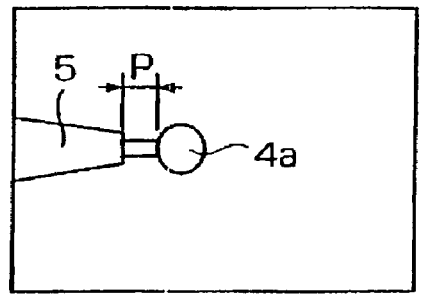
FIG. 3A　　　　　　FIG. 3B

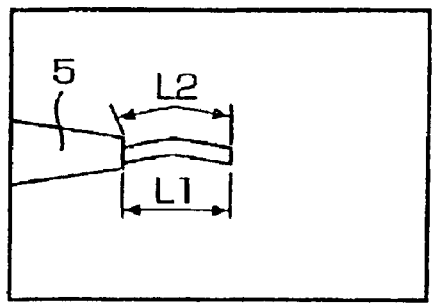
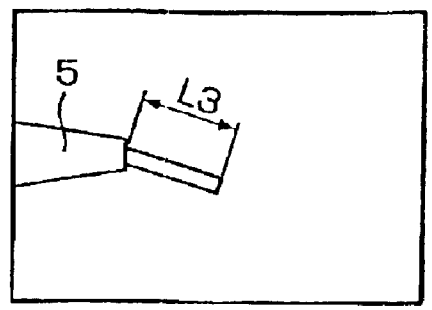
FIG. 3C1    FIG. 3C2
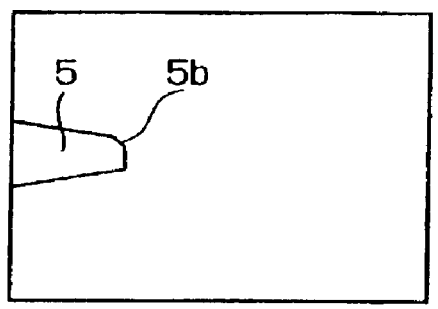
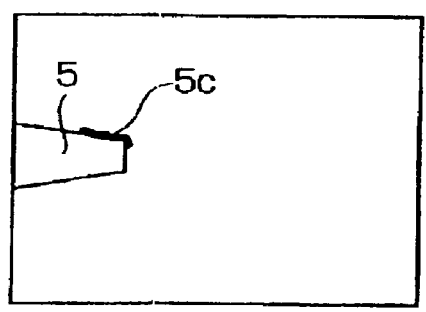
FIG. 3D1    FIG. 3D2
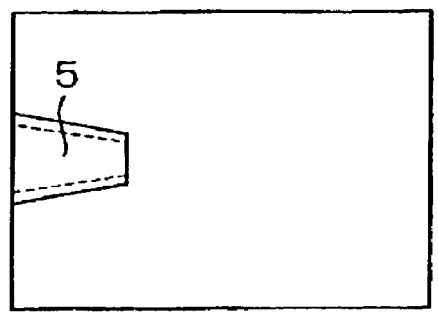
FIG. 3E

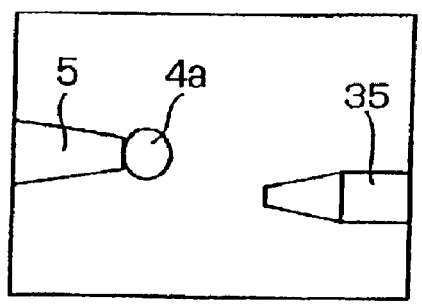
FIG. 5
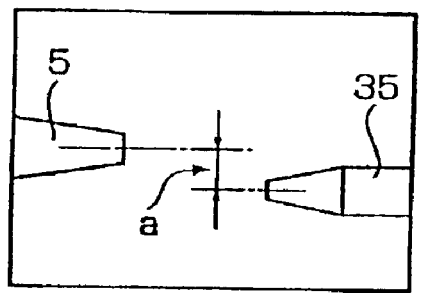 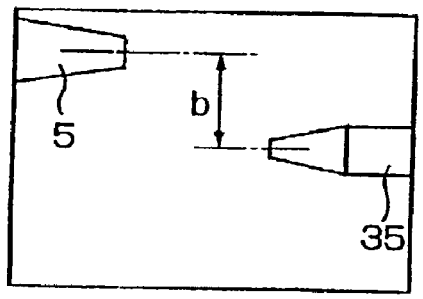
FIG. 6A  FIG. 6B
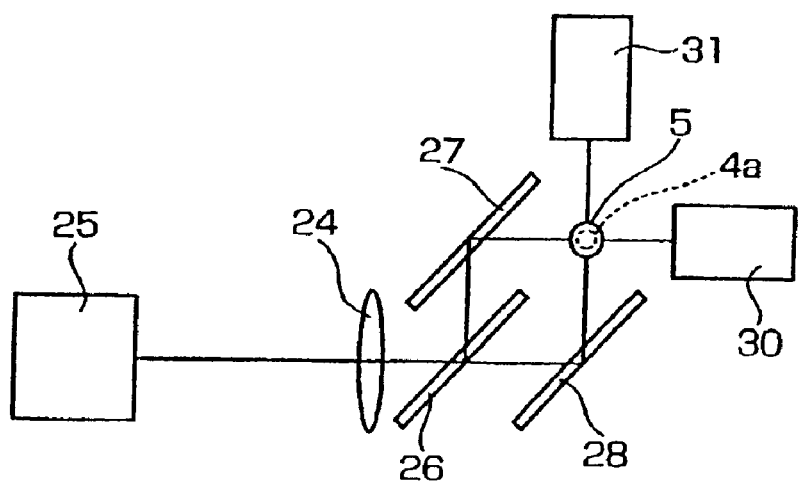
FIG. 7

WIRE BONDING METHOD AND APPARATUS

BACKGROUND OF THE INVENTION

1. Field of the Invention

The present invention relates to a wire bonding method and apparatus.

2. Prior Art

Manufacturing processes for assembled-semiconductor devices such as ICs, etc. include a wire bonding process. In this bonding process, wires 4 are connected to pads 1*a* (first bonding points) of a semiconductor chip 1 on a workpiece 3 and leads 2*a* (second bonding points) on a lead frame 2 as shown in FIG. 12. FIG. 13 shows the wire bonding method used in the above-described wire bonding process, and FIG. 14 shows a wire bonding apparatus 10 for such a process.

In FIG. 13, a ball 4*a* is first formed in step (a) by the spark discharge of an electric torch 6 on a wire 4 that extends from the lower end of a capillary 5. Afterward, the electric torch 6 is moved in the direction indicated by arrow. Next, in step (b), the capillary 5 is moved to a point above the first bonding point 1*a*. Then, in step (c), the capillary 5 is lowered, and the ball 4*a* at the tip end of the wire 4 is connected to the first bonding point 1*a*. Afterward, in step (d), the capillary 5 is raised. Then, in step (e), the capillary 5 is moved to a point above the second bonding point 2*a*; and in step (f), the capillary 5 is lowered and the wire 4 is connected to the second bonding point 2*a*. Subsequently, in step (g), after the capillary 5 has been raised to a fixed position, a damper 7 is closed, and the capillary 5 and damper 7 are raised together, thus cutting the wire 4. One wire connection is thus completed.

Generally, in the above wire bonding method, the deviations of at least two fixed points on the semiconductor chip 1 and at least two fixed points on the lead frame 2 from the regular positions are first detected by the position detection camera 11 shown in FIG. 14, and then bonding coordinates that have been stored in memory beforehand are corrected by a calculating part on the basis of these detected values. In the case of detection by this position detection camera 11, an X-axis motor 12 and Y-axis motor 13 are driven so that the optical axis 11*a* of the position detection camera 11 is positioned directly above the measurement point. After the bonding coordinates have been corrected as described above, the capillary 5 is moved in the directions of the X and Y axes and the direction of the Z axis, and the wire 4 passing through the capillary 5 is wire-bonded to the first bonding point 1*a* and second bonding point 2*a* as illustrated in FIG. 13.

In the above operation, since the optical axis 11*a* of the position detection camera 11 and the axial center 5*a* of the capillary 5 are offset from each other by a distance W, the XY table 15 is moved for the offset amount W by the X-axis motor 12 and Y-axis motor 13 after the deviations of the fixed points have been detected by the position detection camera 11 and the bonding coordinates have been corrected, and then the capillary 5 is positioned above the first bonding point 1*a*. Afterward, the wire 4 is wire-bonded at the above-described corrected bonding coordinates. This is done by the movement of the XY table 15 in the directions of the X and Y axes by the X-axis motor 12 and Y-axis motor 13 and further by the movement of the capillary 5 in the direction of the Z axis by the raising and lowering (or swinging) of the capillary arm 16 caused by the Z-axis motor 14. In FIG. 14, the capillary arm 16 is disposed on a bonding head 17 so that the capillary arm 16 is swingable, and the position detection camera 11 is fastened to the bonding head 17 via a camera holding arm 18. Xw indicates the X-axis component of the offset amount W, and Yw indicates the Y-axis component of the offset amount W.

The size of the ball 4*a* shown in step (a) in FIG. 13 and the length (tail length) and shape, etc. of the wire 4 extending from the lower end of the capillary 5 shown in step (g) in FIG. 13 constitute information that is important in determining the optimal conditions of bonding. Japanese Patent Application Laid-Open (Kokai) No. 60-242627, for instance, discloses a conventional method and apparatus for detecting the ball diameter, tail length and shape, etc. In this apparatus, the ball or the tail length extending from the capillary is detected by a detection means from the side, and the tail length or the ball diameter is measured based thereupon. In this method, since the tail length and ball diameter are directly measured, the optimal bonding conditions can be determined with good precision.

However, the above-described prior art requires a special detection means for measuring the tail length and ball diameter, etc. Accordingly, the apparatus is complicated in structure, and thus the cost of the apparatus tends to be high.

SUMMARY OF THE INVENTION

The object of the present invention is to provide a wire bonding method and apparatus that measures the tail length and ball diameter, etc. using a detection means generally used in wire bonding, without using a special detection means.

The above object is accomplished by unique steps of the present invention for a wire bonding method used in a wire bonding apparatus that is equipped with a capillary, through which a wire passes and which performs bonding on a workpiece, and a position detection camera, which images the workpiece; and in the present invention, the method includes the steps of:

acquiring an image of the area near the lower end of the capillary by way of directing the image to the position detection camera; and processing the image, thus obtaining at least one of:
the diameter of a ball formed on a wire extending from the lower end of the capillary,
the tail length extending from the lower end of the capillary,
the ball position from the undersurface of the capillary,
the bending of the tail of the wire,
the external appearance of the capillary, and
the amplitude of vibration of the capillary when an ultrasonic vibration is applied to the capillary.

The above object is accomplished also by a unique structure of the present invention for a wire bonding apparatus that is equipped with a capillary, through which a wire passes and which performs bonding on a workpiece, and a position detection camera, which images the workpiece; and in the present invention, a light path conversion means is provided so that light path conversion means directs an image of the area near the lower end of the capillary to the position detection camera; and the image taken by the position detection camera is processed, thus obtaining at least one of:
the diameter of a ball formed on a wire extending from the lower end of the capillary,
the tail length extending from the lower end of the capillary, the ball position from the undersurface of the capillary,
the bending of the tail of the wire,
the external appearance of the capillary, and
the amplitude of vibration of the capillary when an ultrasonic vibration is applied to the capillary.

In the above method and apparatus of the present invention, the image acquired by the position detection camera is processed by a data processing means, and a judgment of satisfactory or unsatisfactory nature of the image is made; and a warning is issued by a warning means in a case where the image is judged to be unsatisfactory.

Also, in the above method and apparatus of the present invention, data of ball diameter, tail length and position of the ball from the undersurface of the capillary which are in the image acquired by the position detection camera is processed by a data processing means and then fed back to an electric torch control circuit, a transducer control circuit or a wire pull-up function control circuit.

Further, in the above bonding apparatus of the present invention, the light path conversion means has a lens that constitutes an afocal system in combination with a lens disposed in the position detection camera.

Furthermore, in the above method and apparatus of the present invention, the size on an object plane being measured that corresponds to one pixel of imaging element of the position detection camera is calibrated beforehand for the purpose of measuring the ball diameter, measuring the position of the ball from the undersurface of the capillary, and measuring the tail length.

The above calibration is accomplished by calculating an actual length per pixel according to a position of the capillary in an image acquired by the position detection camera and a position of the capillary in an image acquired, after the capillary has been moved, by the position detection camera.

The above calibration is also performed with a use of a reference member of which image is acquired, together with an image of the capillary, by the position detection camera; and the calibration is accomplished by way of calculating an actual length per pixel according to an image of the reference member acquired by the position detection camera.

The above calibration is further performed with a use of a reference member of which image is acquired, together with an image of the capillary, by the position detection camera; and the calibration is accomplished by way of calculating an actual length per pixel according to the difference between:
positions of the capillary and the reference member in an image acquired by the position detection camera, and
positions of the capillary and the reference member in an image acquired, after the capillary has been moved, by the position detection camera.

BRIEF DESCRIPTION OF THE DRAWINGS

FIGS. 2A and 2B are explanatory diagrams showing the image plane in a case where calibration is performed as shown in FIG. 1 without installing a reference member;

FIGS. 3A and 3B are explanatory diagrams showing the image of the ball, FIGS. 3C1 and 3C2 are explanatory diagrams showing the images of the wire extending from the capillary, FIGS. 3D1 and 3D2 are explanatory diagrams showing the images of damage to the capillary, and FIG. 3E is an explanatory diagram showing the images of the capillary during the application of ultrasonic waves;

FIG. 5 is an explanatory diagram showing one example of the image obtained in a case where calibration is performed with a reference member installed as shown in FIG. 4;

FIGS. 6A and 6B are explanatory diagrams showing another example of the images obtained in a case where calibration is performed with a reference member installed as shown in FIG. 4;

FIG. 7 is an explanatory top view of the bonding apparatus according to the second embodiment of the present invention;

DETAILED DESCRIPTION OF THE INVENTION

Figure 12:
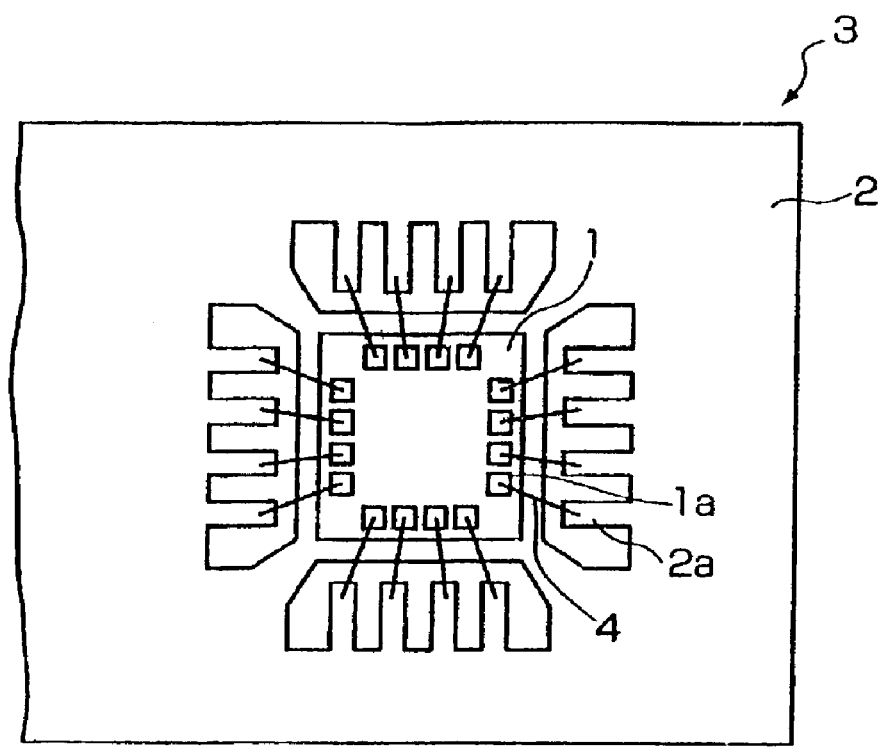
FIG. 12 is a top view of a wire-bonded workpiece.
Figure 13:
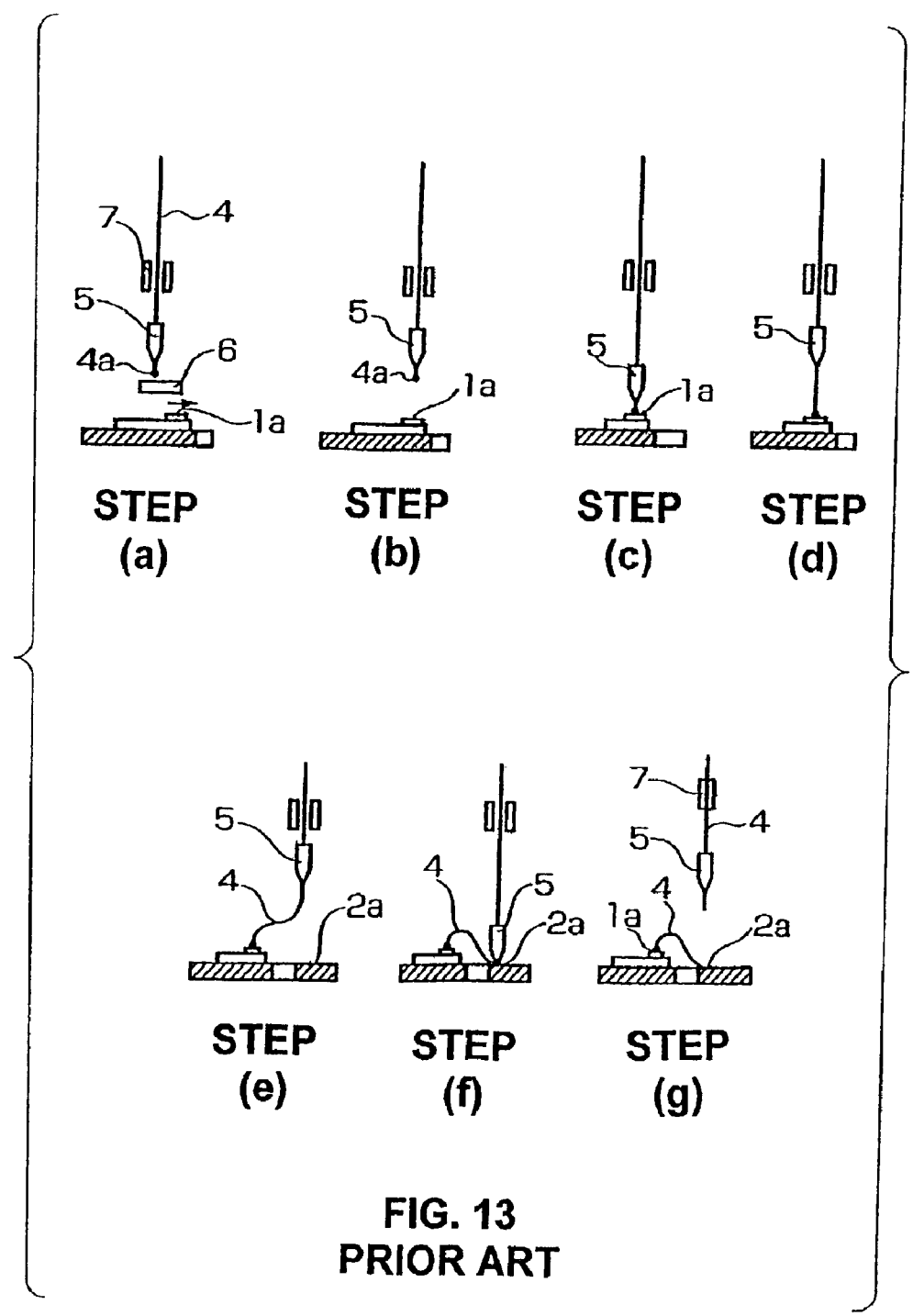
FIG. 13 shows steps (a) through (g) taken in the most common wire bonding method.
Figure 14:
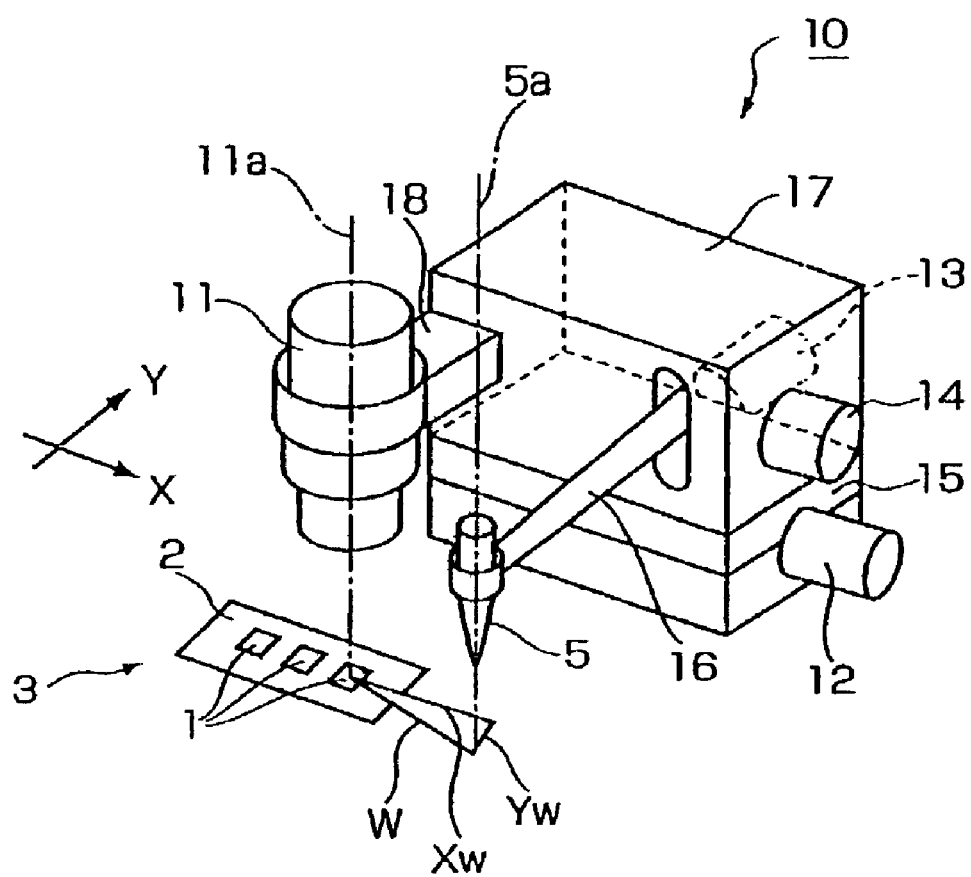
FIG. 14 is a perspective view of a wire bonding apparatus.

The first embodiment of the present invention will be described with reference to FIG. 1. The reference numerals that are the same as or that correspond to those in FIGS. 12 through 14 are labeled with the same reference numerals, and a detailed description of such members is omitted.

The position detection camera 11 is a photoelectric transducer type imaging device equipped with an imaging element (CCD or CMOS, etc.); the focal position of the lens 20 of the optical system of this position detection camera 11 is located at the workpiece level plane 3a. A light path conversion means supporting plate 21 is disposed near a bonding stage (not shown) on which the lead frame 2 shown in FIGS. 12 through 14 is positioned and carried. A light path conversion means 22 and an illumination means 30 are fastened to the light path conversion means supporting plate 21.

A lens 24, which is installed in a vertical position, and a mirror 25, which is installed so as to face the lens 24 so that this mirror 25 crosses the horizontal direction at an angle of 45°, are disposed inside the casing 23 of the light path conversion means 22. In the casing 23, a window 23a is formed to the right of the lens 24, and a window 23b is formed above the mirror 25. The center of the mirror 25 is disposed in the focal position of the lens 20. The inter-object distance d of the lens 24 from the center of the mirror 25 is set so that this distance is more or less equal to the offset amount Xw in the direction of the X axis between the optical axis 11a of the position detection camera 11 and the axial center 5a of the capillary 5.

First, a case in which the diameter of the ball 4a formed in step (a) shown in FIG. 13 (a) is measured will be described. In order to ascertain the absolute value of the diameter of the ball 4a, it is necessary to ascertain the size on the object plane of the synthesizing optical system that corresponds to one pixel of the imaging element of the position detection camera 11. A calibration is performed beforehand for this purpose. Three methods may be used for this calibration.

The first calibration method is performed as follows. The XY table 15 shown in FIG. 14 is driven so that the optical axis 11a of the position detection camera 11 is positioned above the mirror 25. As a result, the capillary 5 is positioned above the focal point of the lens 24. Next, the Z-axis motor 14 is driven so that the capillary 5 is lowered, and the lower end portion of the capillary 5 is positioned in front of the lens 24. As a result, the photographic image (merely called "image") acquired by the position detection camera 11 is as shown in FIG. 2A. Here, the magnification of the lens 24 is 1×. Accordingly, the XY table 15 is moved by α μm. The image obtained in the case of this movement is shown in FIG. 2B. Assuming that the amount of movement of the capillary 5 is β pixels in the image processing, then, since the position detection camera 11 has also moved by α μm together with the capillary 5, the actual length per pixel is ½ of α/β, i.e., α/2β (μm/pixel). In the actual calibration, in order to increase the precision, the XY table 15 is moved at a uniform pitch and numerous data are acquired, after which the calibration value is obtained statistically.

Accordingly, when the diameter of the ball 4a formed in step (a) in FIG. 13 is measured, the XY table 15 is driven in the same manner as described above so that the optical axis 11a of the position detection camera 11 is positioned above the mirror 25. Next, the Z-axis motor 14 is driven so that the capillary 5 is lowered, and the lower end portion of the capillary 5 is positioned in front of the lens 24. As a result, the image acquired by the position detection camera 11 is as shown in FIG. 3A. Assuming that the diameter of the ball 4a is B pixels in the acquired image, then the actual diameter A of the ball 4a obtained by processing performed by the data processing means is A=B×α/2β (μm). The absolute value of the diameter of the ball 4a is an important information for determining the optimal bonding conditions. Furthermore, defective balls can be detected by measuring the diameter of the ball 4a for each bonding operation. In the case of defective balls, the operator can be warned by means of a warning lamp, a warning alarm, etc. Furthermore, balls 4a of a fixed optimal size can be formed by measuring the diameter of the balls 4a, and feeding this information back to the control circuit of the electric torch 6 used to form the balls 4a, the control circuit of the transducer, or the wire pull-up function control circuit.

FIG. 3B shows a case in which the distance P from the undersurface of the capillary 5 to the position of the ball 4a is measured. Ordinarily, the wire 4 is pulled from the state shown in FIG. 3B and placed in the state shown in FIG. 3A before bonding is performed. Constantly stable bonding with good precision can be performed by measuring the distance P in the state shown in FIG. 3B, confirming that this distance is a specified length, and performing bonding after feeding information back to the wire pull-up function control circuit and adjusting the distance to the specified length in cases where the distance is not this specified length.

Figure 1:
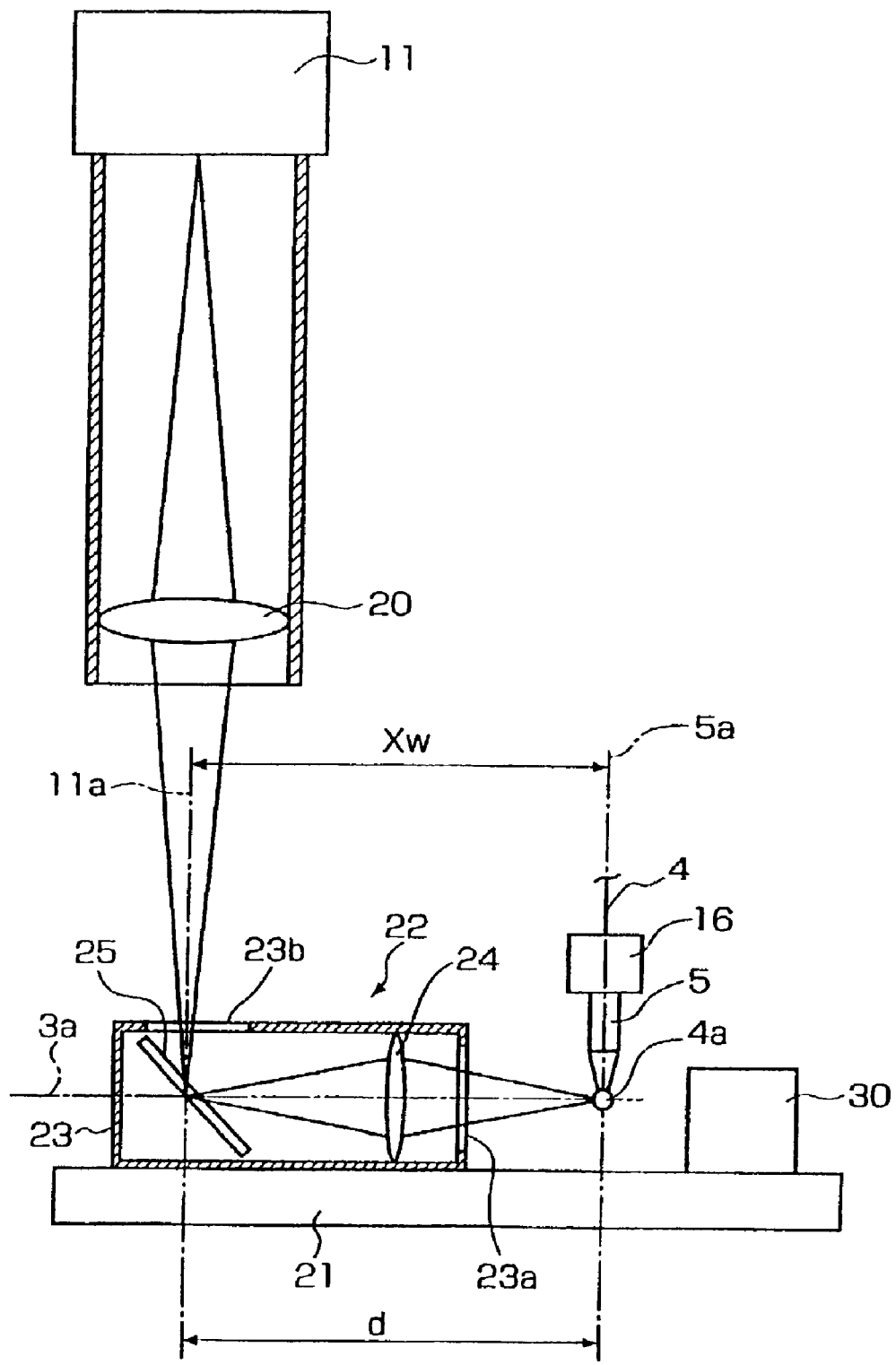
FIG. 1 is a partially sectional front view of the essential portion of the bonding apparatus according to the first embodiment of the present invention.

FIGS. 3C1 and 3C2 show images of the wire 4 extending from the lower end of the capillary 5 formed in step (g) of FIG. 13. The diameter of the ball 4a depends on the length (tail length L) of the wire 4 extending from the lower end of the capillary 5. In cases where the operation that forms the ball 4a is performed immediately prior to bonding, an effect similar to that obtained in a case where the ball 4a is measured can be obtained by measuring the tail length L. More specifically, if the tail length L in the image that is acquired is C pixels, then the tail length L=C×α/2β (μm). Furthermore, cases in which the shape of the wire 4 is unsuitable, e.g., cases in which the tip end of the wire is, for instance, bent, can be also discriminated by means of this image. In the measurement of the tail length L, the perpendicular length L1, or the length L2 or L3, etc. along the tail is measured.

FIGS. 3D1 and 3D2 show the images obtained in a case where the capillary 5 is inspected. If it is ascertained that the capillary 5 is damaged at 5b as shown in FIG. 3D1 or that foreign matter 5c is adhering to the capillary 5 as shown in FIG. 3D2, then a warning indicating that the capillary 5 must be replaced, or a warning indicating that the capillary 5 must be cleaned, is sent to the operator by means of a warning lamp, a warning alarm, etc.

FIG. 3E shows the image obtained when ultrasonic waves are applied to the capillary 5. Before the ultrasonic waves are applied, a silhouette of the capillary 5 is imaged as indicated by the dotted line. When the ultrasonic waves are applied, the capillary 5 vibrates, and a silhouette of the capillary 5 is imaged as indicated by the solid line. Accordingly, the vibrational amplitude of the capillary 5 can be ascertained by measuring the increase in the width of the capillary 5. This value is fed back for the control of an ultrasonic wave driving source, so that the ultrasonic wave driving source is constantly maintained in an optimal state.

Next, the second calibration method will be described.

Figure 4:
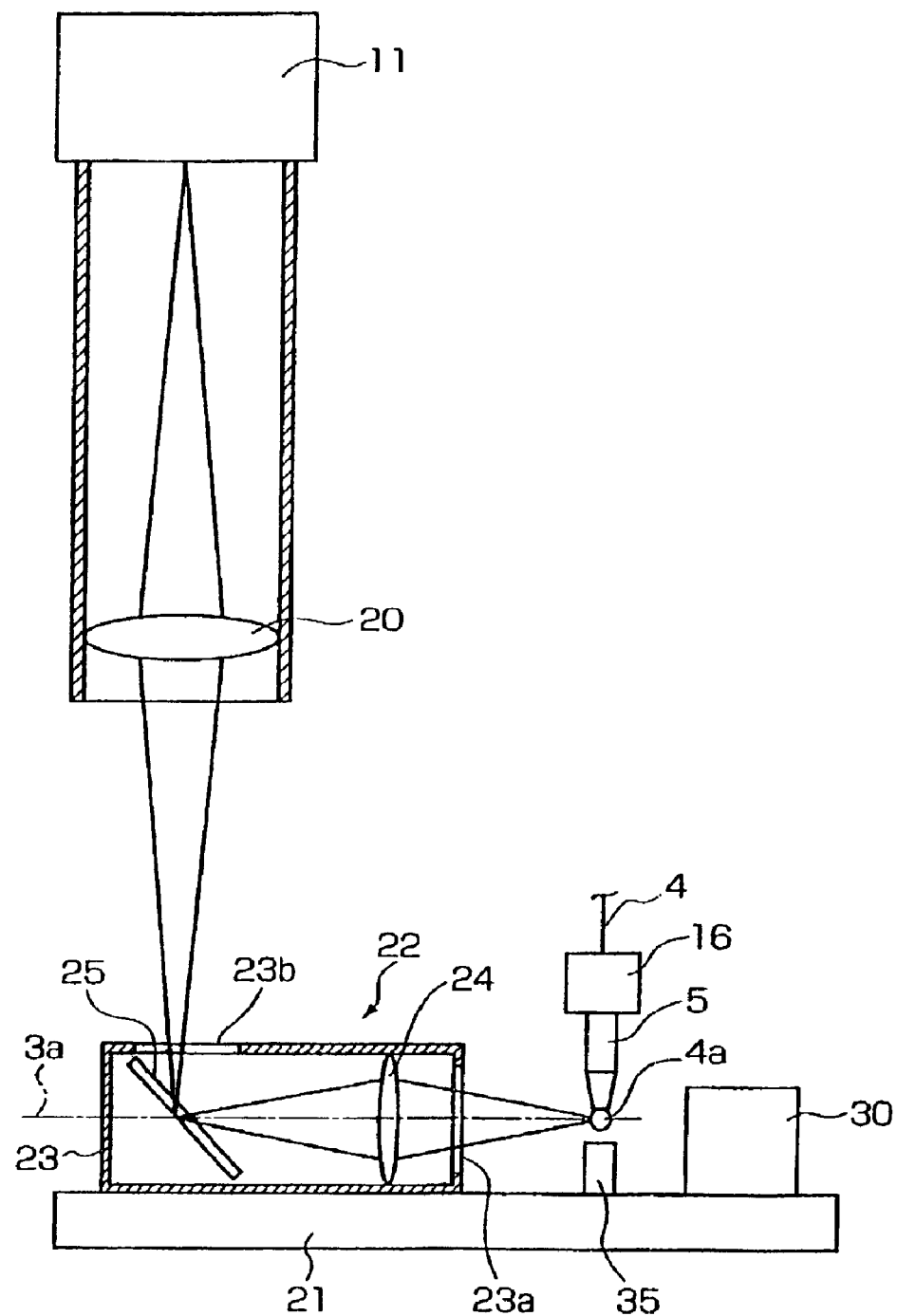
FIG. 4 is a partially sectional front view of the essential portion of the bonding apparatus of the first embodiment in which a reference member is provided.

FIG. 4 shows a structure in which a reference member 35 is disposed in the focal position of the lens 24. The image acquired in this case is shown in FIG. 5. The width of the reference member 35 is known, and the number of pixels occupied by this width is investigated beforehand. In cases where the diameter of the ball 4a is measured, the actual diameter of the ball 4a can be ascertained by means of the number of pixels of the diameter of the ball 4a that is measured. By way of thus providing the reference member 35, the absolute values of the ball diameter and tail length, etc. can be ascertained even if a calibration is not performed by a method that moves the capillary 5 by the XY table 15 as described above.

Next, the third calibration method will be described. This is another example of a case in which a reference member 35 is provided as shown in FIG. 4.

Here, in the same manner as described above, the XY table 15 shown in FIG. 14 is driven so that the optical axis 11a of the position detection camera 11 is positioned above the mirror 25. Next, the Z-axis motor 14 is driven so that the capillary 5 is lowered, and the lower end portion of the capillary 5 is positioned in front of the lens 24. As a result, the image of the capillary 5 and reference member 35 acquired by the position detection camera 11 is as shown in FIG. 6A. The XY table 15 on which the capillary 5 is provided is then moved by α μm. The image obtained in the case of this movement is shown in FIG. 6B. Assuming that the number of pixels between the capillary 5 and the reference member 35 in the image plane is such that a (number of) pixels in the case of FIG. 6A become b (number of) pixels in the case of FIG. 6B, then the actual length per pixel is α/(b−a) (μm/pixel). As a result, the absolute values of the ball diameter and tail length, etc. can be ascertained.

The second embodiment of the present invention will be described with reference to FIG. 7.

In the above embodiment, an object such as the ball 4a, wire 4 (tail length L) or capillary 5, etc. is observed from only one direction. In the second embodiment, however, such an object is observed from two directions, i.e. from the directions of the X and Y axes.

In other words, in addition to the lens 24 and mirror 25 shown in the first embodiment, one half-mirror 26 and two mirrors 27 and 28 are disposed inside the casing 23 of the light path conversion means 22 of the second embodiment. The half-mirror 26 is disposed on the right side of the lens 24, the mirror 27 is disposed above the half-mirror 26, and the mirror 28 is disposed on the right side of the half-mirror 26. The reflective surface of the mirror 27 and the reflective surface of the half-mirror 26 are parallel to each other, and both of these reflective surfaces cross the direction of the X axis at an angle of −45°. The reflective surface of the mirror 28 crosses the direction of the X axis at an angle of 45°. Illumination means 30 and 31 are disposed on both sides of the object so as to face the mirrors 27 and 28.

In the above structure, when, for instance, the diameter of the ball 4a is measured, the position detection camera 11 shown in FIG. 1 is moved to a point above the mirror 25 in the same manner as in the first embodiment, and the capillary 5 is lowered and moved in front of the mirrors 27 and 28. Then, when the illumination means 31 is extinguished and the illumination means 30 is lit, the image of the capillary 5 and ball 4a in the direction of the X axis is reflected by the mirror 27 and half-mirror 26 as a shadow with respect to the light of the illumination means 30, and this image passes through the lens 24 and is reflected by the mirror 25, so that an image as shown in FIG. 3A in the direction of X axis is acquired by the position detection camera 11 through the lens 20 shown in FIG. 1. As a result, the diameter of the ball 4a in the direction of X axis is measured by the same way as in the first embodiment.

On the other hand, when the illumination means 30 is extinguished and the illumination means 31 is lit, the image of the capillary 5 and ball 4a in the direction of the Y axis is reflected by the mirror 28 as a shadow with respect to the light from the illumination means 31, and this image passes through the half-mirror 26 and lens 24 and is reflected by the mirror 25, so that an image as shown in FIG. 3A in the direction of Y axis is acquired by the position detection camera 11 through the lens 20 shown in FIG. 1. As a result, the diameter of the ball 4a in the direction of Y axis is measured by the same way as in the above-described embodiment.

It goes without saying that the distance P of the ball 4a from the undersurface of the capillary 5 shown in FIG. 3B (in the direction of both X axis and Y axis), the tail lengths L1, L2 and L3 and bent state of the wire 4 shown in FIGS. 3C1 and 3C2, and the damage 5b or adhesion of foreign matter 5c, etc. to the capillary 5 shown in FIGS. 3D1 and 3D2 are investigated in the like manner as in the first embodiment.

Figure 8:
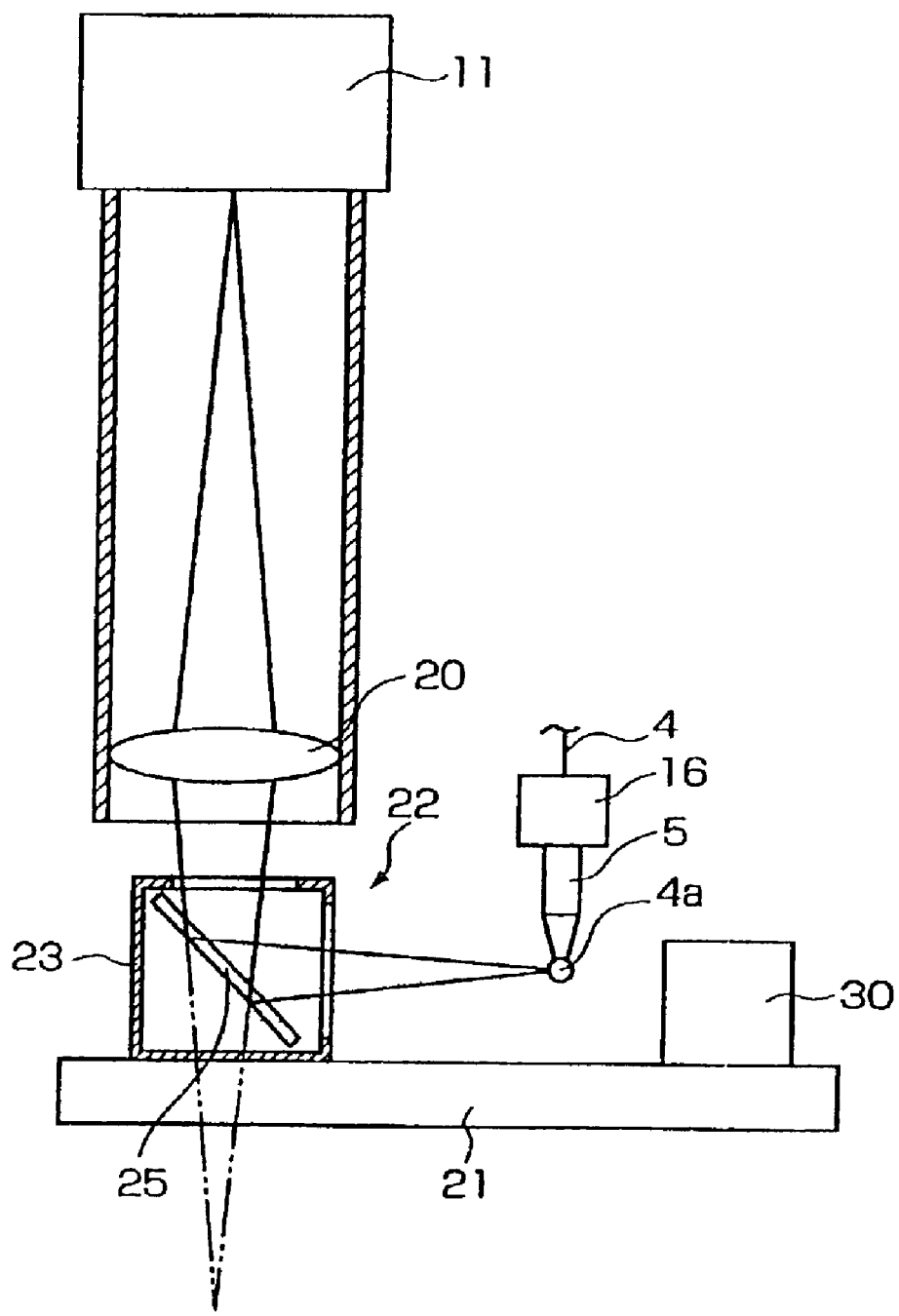
FIG. 8 is a partially sectional front view of the essential portion of the bonding apparatus according to the third embodiment of the present invention.

The third embodiment of the present invention will be described with reference to FIG. 8.

In this third embodiment, only a mirror 25 is disposed inside the casing 23 of the light path conversion means 22. When the capillary 5 is positioned in front of the mirror 25, the lens 20 is raised or lowered by a driving means (not shown) so that the lens 20 is focused on the capillary 5.

The effect same as that of the respective embodiments described above is obtained by using the structure of FIG. 8.

In the third embodiment, it is also possible to move only the lens 20 inside the lens barrel instead of raising and lowering the lens 20 and position detection camera 11 as a whole. Though only a single lens 20 is shown in the structure of FIG. 8, ordinarily, this lens is constructed from a plurality of lenses; and it is also possible to adjust the focus by moving specified lenses among these lenses without moving the lens barrel.

In the respective embodiments described above, prisms can be employed instead of the mirrors 25, 27 and 28.

The fourth embodiment of the present invention will be described with reference to FIG. 9.

In this embodiment, the casing 41 of the light path conversion means 40 is provided therein with: a mirror 42 which is disposed at the workpiece level plane 20a of the lens 20 so that the mirror 42 crosses the horizontal direction at an angle of 45°, a mirror 43 which is disposed above this mirror 42 so that the mirror 43 crosses the horizontal direction at an angle of −45°, a lens 44 which is disposed on the left side of this mirror 43, and a mirror 45 which is disposed on the left side of this lens 44 so that this mirror 45 crosses the horizontal direction at an angle of 45°. The casing 41 has a window 41a that is formed on the right side of the mirror 42, and a window 41b is formed above the mirror 45. Furthermore, an illumination means 50 which emits parallel illuminating light is disposed so as to face the mirror 42.

In this structure, as in the respective embodiment described above, the XY table 15 shown in FIG. 14 is driven so that the position detection camera 11 is moved to a point above the mirror 45, and the capillary 5 is lowered and moved in front of the mirror 42. The image of the lower end portion of the capillary 5 is reflected by the mirrors 42 and 43. This image passes through the lens 44 and is reflected by the mirror 45, and the image is acquired by the position detection camera II through the lens 20. More specifically, images of the ball 4a shown in FIGS. 3A and 3B and images of the wire 4 shown in FIGS. 3C1 and 3C2 or of the capillary 5 shown in FIGS. 3D1 and 3D2 are obtained.

Consequently, as in the respective embodiments described above, the diameter of the ball 4a shown in FIG. 3A is measured, the distance P from the undersurface of the capillary 5 to the ball 4a shown in FIG. 3B is measured, the tail lengths L1, L2 and L3 shown in FIGS. 3C1 and 3C2 is measured, the bent state of the wire 4 shown in FIGS. 3C1 and 3C2 is ascertained, and the damage 5b, adhesion of foreign matter 5c, etc. to the capillary 5 shown in FIGS. 3D1 and 3D2 is detected.

In the fourth embodiment, an afocal system is constructed by a combination of the lens 20 and lens 44. If the synthetic focal distance of the lens 20 is f1, and the synthetic focal distance of the lens 44 is f2, then the distance between the front-side main plane of the lens 20 and the rear-side main plane of the lens 44 is set at f1+f2. Furthermore, since the magnification is expressed as f1/f2, it is sufficient to select the value of f2 so that an appropriate magnification is obtained. Since the system is thus an afocal system, good images can be obtained regardless of the position of the capillary 5 in the horizontal direction.

The fifth embodiment of the present invention will be described with reference to FIG. 10.

Figure 9:
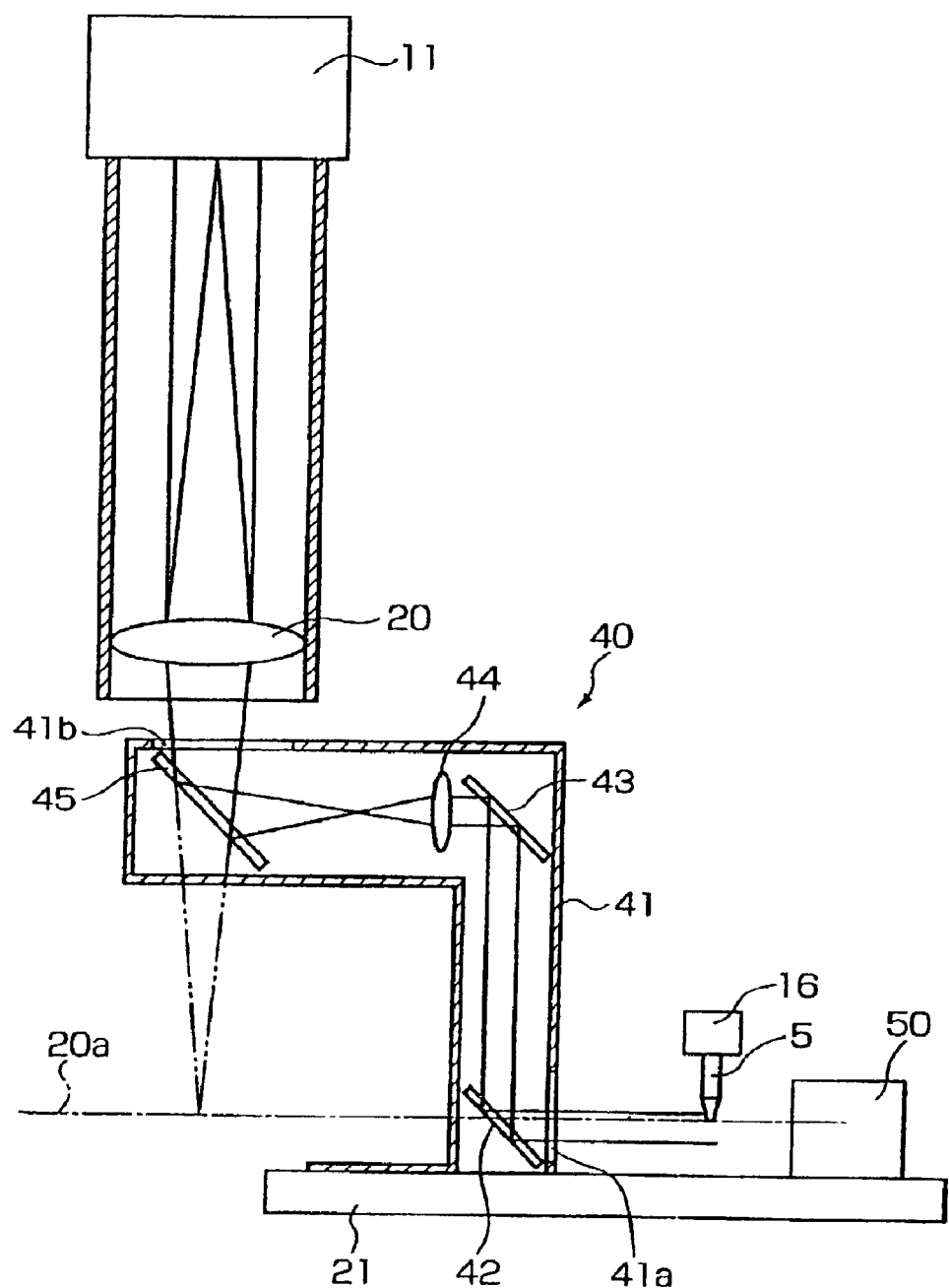
FIG. 9 is a partially sectional front view of the essential portion of the bonding apparatus according to the fourth embodiment of the present invention.

In this embodiment, the structure is similar to that of the fourth embodiment shown in FIG. 9, but the object (area near the lower end of the capillary 5) is observed from two directions, i.e., from the directions of the X and Y axes, as in the same manner as in the second embodiment shown in FIG. 7.

More specifically, in the fifth embodiment, a half-mirror 46, mirrors 47 and 48 and illumination means 51 are further disposed additionally to the structure of the light path conversion means 40 shown in FIG. 9. The half-mirror 46 is disposed on the right side of the mirror 42, and an illumination means 50 is disposed so as to face the half-mirror 46. The mirror 47 is disposed on the lower side (in FIG. 10) of the half-mirror 46, and the mirror 48 is disposed on the right side of the mirror 47. The illumination means 51 is disposed so as to face the mirror 48. The reflective surface of the mirror 47 and the reflective surface of the half-mirror 46 are oriented parallel to each other, and both of these reflective surfaces cross the direction of the X axis at an angle of 45°. The reflective surface of the mirror 48 crosses the direction of the X axis at an angle of −45°.

In this structure, as in the case of the embodiment shown in FIG. 7, when the illumination means 51 is extinguished and the illumination means 50 is lit, the image of, for instance, the capillary 5 and ball 4a in the direction of X axis passes through the half-mirror 46 as a shadow with respect to the light from the illumination means 50 and is reflected by the mirrors 42 and 43. This image then passes through the lens 44 and is reflected by the mirror 45, so that the image as shown in FIGS. 3A and 3B in the direction of X axis is acquired by the position detection camera 11 through the lens 20 shown in FIG. 9. On the other hand, when the illumination means 50 is extinguished and the illumination means 51 is lit, then the image of, for instance, the capillary 5 and ball 4a in the direction of Y axis is reflected by the reflective surface of the half-mirror 46 from the mirrors 48 and 47 as a shadow with respect to the light from the illumination means 51. This image is reflected by the mirrors 42 and 43, then passes through the lens 44 and is reflected by the mirror 45, so that the image as shown in FIGS. 3A and 3B in the direction of Y axis is acquired by the position detection camera 11 through the lens 20.

In the structure of the light path conversion means 22 shown in FIG. 7, it is necessary to set the lengths of the light path of the illumination means 30 from the object (area near the lower end of the capillary 5) to the lens 24 and the light path of the illumination means 31 from the object (area near the lower end of the capillary 5) to the lens 24 so that these lengths are equal. If these lengths are not equal, then neither focus can be obtained. To the contrary, in the embodiment shown in FIG. 10, an afocal system is employed. Accordingly, there is no need to set the light path of the illumination means 50 from the object (area near the lower end of the capillary 5) to the lens 44 and the light path of the illumination means 51 from the object (area near the lower end of the capillary 5) to the lens 44 so that these light paths are equal.

The sixth embodiment of the present invention will be described with reference to FIG. 11.

In this sixth embodiment, the mirror 42 used in the fifth embodiment is eliminated, and the object (the area near the lower end of the capillary 5) is viewed obliquely using a prism 55 that has a 45° deflection angle instead of the mirror 43. Since the sixth embodiment is of an afocal system, there is no deterioration in the silhouette image of the object even if the object is viewed from an oblique angle. Furthermore, since observation is performed from above at an oblique angle, the light path conversion means 40 can be mounted on the XY table 15 shown in FIG. 14. As a result, there is no need to install the light path conversion means 40 near the workpiece 3.

Figure 10:
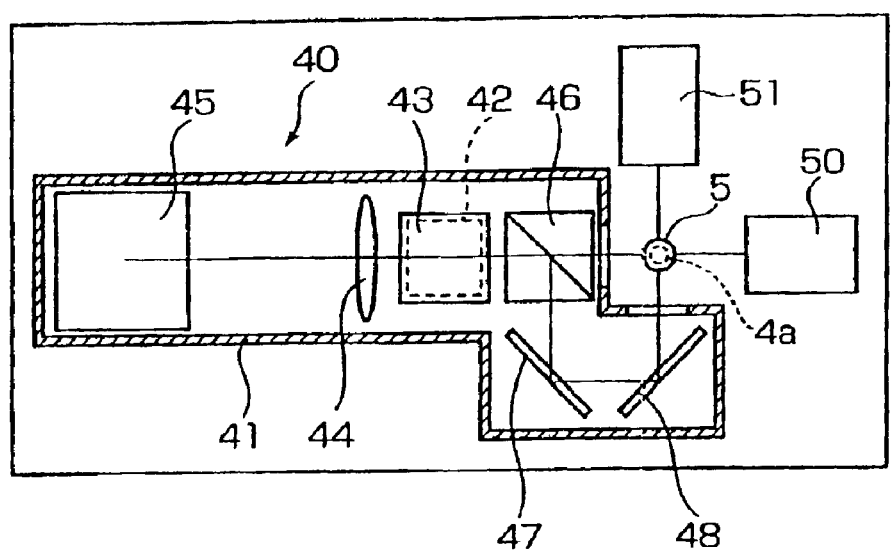
FIG. 10 is a partially sectional front view of the essential portion of the bonding apparatus according to the fifth embodiment of the present invention.
Figure 11:
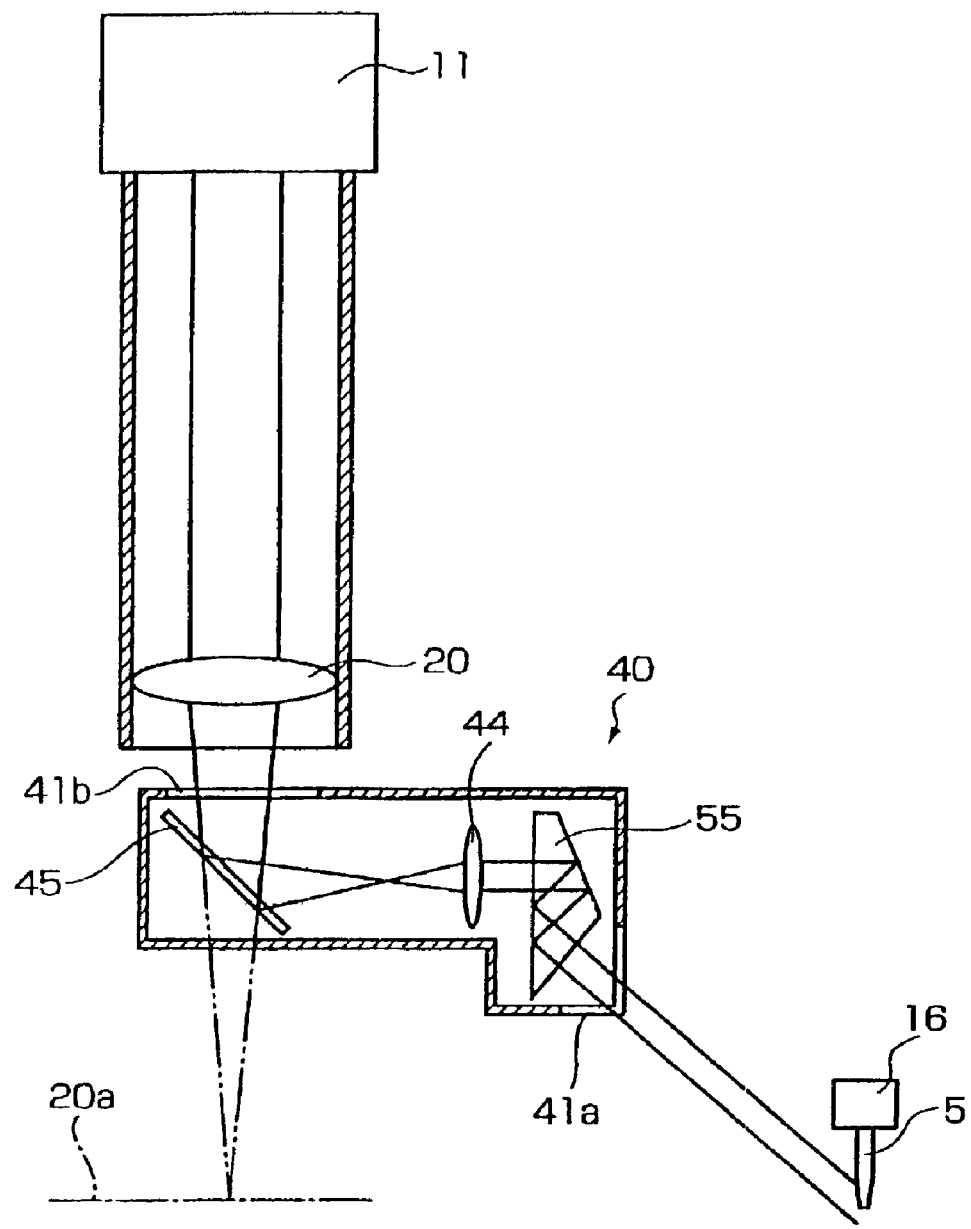
FIG. 11 is a partially sectional front view of the essential portion of the bonding apparatus according to the sixth embodiment of the present invention.

In the respective above-described embodiments shown in FIGS. 9, 10 and 11, it is also possible to use prisms instead of the mirrors 42, 43, 45, 47 and 48. Moreover, in the embodiment shown in FIG. 11, it is also possible to use a mirror instead of the prism 55 with a deflection angle of 45°, and the deflection angle is not necessarily 45°.

It goes without saying that in the fifth and sixth embodiments, the distance P of the ball 4a from the undersurface of the capillary 5 shown in FIG. 3B (both in the direction of X axis and in the direction of Y axis), the tail lengths L1, L2 and L3 and bent state of the wire 4 shown in FIGS. 3C1 and 3C2, and the damage 5b or adhesion of foreign matter 5c, etc. to the capillary 5 shown in FIGS. 3D1 and 3D2 can be investigated.

As seen from the above, in the system of the present invention, the image of the area near the lower end of the capillary is acquired by the position detection camera, and this image is processed, thus obtaining the diameter of a ball formed on a wire extending from the lower end of the capillary, the tail length extending from the lower end of the capillary, the ball position from the undersurface of the capillary, the bending of the tail of the wire, the external appearance of the capillary, and the amplitude of vibration of the capillary when an ultrasonic vibration is applied to the capillary. Accordingly, there is no need to install a special detection means that measures the tail length or ball diameter; and consequently, the bonding apparatus is simple in structure, and there is no increase in cost. Furthermore, the obtained measured values can be fed back so that optimal bonding can always be performed.

What is claimed is:

1. A wire bonding method for a wire bonding apparatus equipped with:
   a capillary through which a wire passes and which performs bonding on a workpiece,
   a position detection camera which images said workpiece, and
   a light path conversion means that directs an image near a lower end of said capillary to said position detection camera,
   said method comprising the steps of:
   acquiring, with said light path conversion means, an image of an area near a lower end of said capillary by way of directing said image to said position detection camera, and
   processing said image, thus obtaining at least one of:
      a diameter of a ball formed on a wire extending from the lower end of said capillary,
      a tail length extending from the lower end of said capillary,
      a ball position from an undersurface of said capillary,
      bending of a tail of said wire,
      an external appearance of said capillary, and
      amplitude of vibration of said capillary when an ultrasonic vibration is applied to said capillary.

2. The wire bonding method according to claim 1, wherein said image acquired by said position detection camera is processed by a data processing means, and a judgment of satisfactory or unsatisfactory nature of said image is made; and a warning is issued by a warning means in a case where said image is judged to be unsatisfactory.

3. The wire bonding method according to claim 1, wherein data of ball diameter, tail length and position of said ball from said undersurface of said capillary which are in said image acquired by said position detection camera is processed by a data processing means and then fed back to one of an electric torch control circuit, a transducer control circuit and a wire pull-up function control circuit.

4. A wire bonding method for a wire bonding apparatus equipped with:

a capillary through which a wire passes and which performs bonding on a workpiece, and a position detection camera which images said workpiece, said method comprising the steps of:

acquiring an image of an area near a lower end of said capillary by way of directing said image to said position detection camera, and processing said image, thus obtaining at least one of:
- a diameter of a ball formed on a wire extending from the lower end of said capillary,
- a tail length extending from the lower end of said capillary,
- a ball position from an undersurface of said capillary,
- bending of a tail of said wire,
- an external appearance of said capillary, and
- amplitude of vibration of said capillary when an ultrasonic vibration is applied to said capillary; and
- wherein size on an object plane being measured that corresponds to one pixel of imaging element of said position detection camera is calibrated beforehand for the purpose of measuring the ball diameter, the position of said ball from said undersurface of said capillary, and the tail length.

5. The wire binding method according to claim 4, wherein said calibration is accomplished by calculating am actual length per pixel according to a position of said capillary in an image acquired by said position detection camera and a position of said capillary in an image acquired, after said capillary has been moved, by said position detection camera.

6. The wire bonding method according to claim 4, wherein said calibration is performed with a use of a reference member of which image is acquired, together with an image of said capillary, by said position detection camera; and said calibration is accomplished byway of calculating an actual length per pixel according to an image of said reference member acquired by said position detection camera.

7. The wire bonding method according to claim 4, wherein said calibration is performed with a use of a reference member of which image is acquired, together with an image of said capillary, by said position detection camera; and said calibration is accomplished by way of calculating an actual length per pixel according to the difference between:
- positions of said capillary and said reference member in an image acquired by said position detection camera, and
- positions between said capillary and said reference member in an image acquired, after said capillary has been moved, by said position detection came.

* * * * *